United States Patent [19]

Hoheisel et al.

[11] Patent Number: 4,882,296
[45] Date of Patent: Nov. 21, 1989

[54] HIGHLY BLOCKING THIN FILM DIODE HAVING A-SI:H FOR IMAGE SENSOR ROWS

[75] Inventors: Martin Hoheisel; Gerhard Brunst; Enno Holzenkaempfer, all of Munich, Fed. Rep. of Germany

[73] Assignee: Siemens Aktiengesellschaft, Berlin and Munich

[21] Appl. No.: 204,962

[22] Filed: Jun. 8, 1988

Related U.S. Application Data

[62] Division of Ser. No. 890,113, Jul. 28, 1986, abandoned.

[30] Foreign Application Priority Data

Aug. 23, 1985 [DE] Fed. Rep. of Germany ....... 3530235

[51] Int. Cl.⁴ ................... H01L 31/10; H01L 31/18
[52] U.S. Cl. ..................................... 437/184; 437/4; 357/2; 156/643; 156/646
[58] Field of Search ................... 437/181, 4, 2, 3; 357/2, 15

[56] References Cited

U.S. PATENT DOCUMENTS

| | | | |
|---|---|---|---|
| 4,282,537 | 8/1981 | Balberg | 357/2 |
| 4,291,318 | 9/1981 | Sansregret | 357/2 |
| 4,398,054 | 8/1983 | Madan | 437/4 |
| 4,484,809 | 11/1984 | Coleman | 357/2 |
| 4,554,478 | 11/1985 | Shimomoto et al. | 437/184 |
| 4,569,719 | 2/1986 | Coleman | 156/646 |

Primary Examiner—Brian E. Hearn
Assistant Examiner—Tuan Nguyen
Attorney, Agent, or Firm—Hill, Van Santen, Steadman & Simpson

[57] ABSTRACT

A highly blocking diode structure having a thin film a-Si:H (amorphous silicon containing hydrogen) layer, suitable for use in constructing image sensor arrays, has two conductive electrodes disposed on opposite sides of the a-Si:H thin film layer. The structure is constructed on an electrically insulating substrate and includes a barrier layer disposed between the a-Si:H layer and the top electrode. The top electrode may consist of indium tin oxide or of palladium silicide, and the barrier layer may consist of silicon oxide produced by converting the surface of the a-Si:H layer. The barrier layer is disposed on that side of the a-Si:H layer opposite the substrate. The barrier layer significantly improves the behavior of the contacts and the stability of the boundary surface between the a-Si:H layer and the transparent metal oxide comprising the electrode. The sequence for constructing the diode arrangement is considerably simplifed.

10 Claims, 1 Drawing Sheet

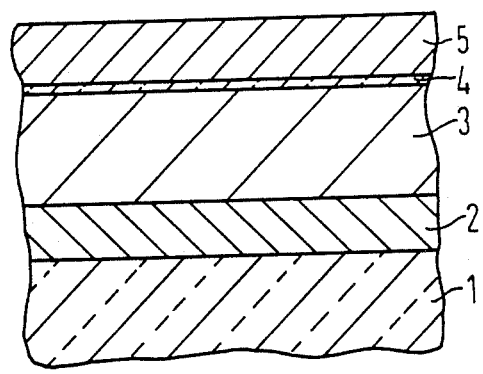

HIGHLY BLOCKING THIN FILM DIODE HAVING A-SI:H FOR IMAGE SENSOR ROWS

This is a division, of application Ser. No. 890,113 filed, July 28, 1986 abandoned.

BACKGROUND OF THE INVENTION

1. Field of the Invention

The present invention relates to diode structures containing a-Si:H (amorphous silicon containing hydrogen) for use in image sensor arrays, wherein the a-Si:H arranged as a thin film between two conductive electrodes on a substrate of electrically insulating material.

2. Description of the Prior Art

The structure and manufacturing techniques for large-area inexpensive image sensors by means of thin film technology utilizing a layer of a Si:H disposed between two electrodes are discussed, for example, in a report by Holzenkaempfer et al. in the Proc. of the MRS Europe, Strasbourg (1984), at pages 575–579.

In addition to a high photo-sensitivity, sensors to be used, for example, in image sensor arrays, such as in office communications equipment, must also exhibit a low dark current, uniform current-voltage characteristics of the individual elements within an array, and a good stability even after being illuminated for a long time. Disparities and malfunctions in all of these areas can result from events occurring at the contact boundary surfaces of the sensors.

A highly blocking diode arrangement for use in sensor rows is described in an article by Kaneko et al in the Journal of Non-Crystalline Solids, 50/60 (1983) at pages 1227–1230. The diode arrangement described therein has a barrier layer of silicon nitride disposed between a transparent indium tin oxide electrode and a semiconductor body consisting of a-Si:H. The a-Si:H body consists of a double layer of intrinsic a-Si:H (2.5 nm) and p-type doped a-Si:H (200 nm). The barrier layer of silicon nitride is situated at the side of the semiconductor body (intrinsic a-Si:H) facing a glass substrate on which incoming light is incident. Manufacture of this known arrangement requires significant technological outlay because of the deposition of a plurality of layers, with the accompanying risk of doping entrainment in the deposition of the boron doped p+ intermediate layer of amorphous silicon.

Another structure for improving the blocking properties of sensor arrangements using a-Si:H as a photoconductor is described in a report by Yamamoto et al in the Extended Abstracts of the 15th Conference on Solid State Devices and Materials, Tokyo, 1983, pages 205–208. In addition to the photodiode, the diode arrangement described therein contains a blocking diode instead of a barrier layer. This structure requires a number of complex and time-consuming process steps to manufacture, because p+ and $n^n$ a-Si:H layers are used in addition to the a-Si:H layer, and these layers must be produced in different reactors. Moreover, as in the Kaneko arrangement, the risk of doping entrainment is also present.

Another blocking diode arrangement of this type is described in a report by Yamamoto et al in the Jap. J. Appl. Phys., 20 Suppl. 2, 185–188 (1981). The metals palladium and gold are used as electrodes.

SUMMARY OF THE INVENTION

It is an object of the present invention to provide a diode arrangement having an a-Si:H thin film layer which has improved both blocking behavior of the contacts on the amorphous silicon layer, and chemical stability.

It is a further object of the present invention to provide such improved blocking behavior given the use of transparent contacts consisting of conductive oxides, thin metal layers, or silicides.

Another object of the present invention is to provide such a diode arrangement which is simple to manufacture.

The above objects are achieved in accordance with the principles of the present invention in a diode structure, wherein the base electrode consists of a metal, the transparent surface electrode consists of a conductive oxide or of a metal silicide, and the semiconductor body of a-Si:H is undoped or weakly doped, and wherein a barrier layer of silicon oxide $_2$ is disposed on that side of the a-Si:H layer opposite the substrate.

This structure permits production of large area sensor arrays in a very simple manner, these sensor arrays meeting current demands with respect to electrical properties such as reverse currents and dielectric strength. The silicon oxide $_2$ layer which is generated improves the chemical stability of the boundary surface between the amorphous silicon and the conductive oxide of the transparent electrode. This enables reproducable manufacture of sensor arrays.

DESCRIPTION OF THE DRAWINGS

The single FIGURE is a side sectional view of a diode constructed in accordance with the principles of the present invention.

DESCRIPTION OF THE PREFERRED EMBODIMENTS

A diode constructed in accordance with the principles of the present invention is shown in section in the drawing. The diode is constructed on an insulated substrate 1 consisting, for example, of glass. A metallic base electrode 2 is disposed on the substrate 1. The base electrode 2 may consist, for example, of titanium and may have a thickness of, for example, 300 nm.

An undoped a-Si:H layer 3 is disposed above the base electrode 2. The a-Si:H layer 3 may have a thickness, for example, of approximately 1000 nm. A barrier layer 4, consisting of silicon oxide, is disposed over the a-Si:H layer 3. The barrier layer 4 may have a thickness of, for example, about 1 nm. A transparent surface electrode 5 is disposed above the barrier layer 4. The surface electrode 5 may consist, for example, of indium tin oxide having a thickness of, for example, about 100 nm, or of palladium silicide having a thickness of, for example, about 10 nm. In use, the diode is arranged so that illuminating light is incident on the side thereof having the transparent surface electrode 5.

Formation of the Silicon oxide $_2$ barrier layer 4 can be undertaken in a number of ways. One manner for generating the layer 4 is by tempering the exposed a-Si:H layer 3 in oxygen at 200° C. at a pressure of 1000 mbar for approximately 30 minutes. Another method is to oxidize the layer 3 in air at room temperature at a pressure of 1000 mbar for about 14 days. The layer 4 can also be generated by plasma oxidizing the layer 3 in oxygen at 35° C. (substrate temperature) at 0.4 mbar pressure for 10 minutes (flow of 100 sccm, power of 0.5W/cm$^2$). A further method is to incinerate the photoresist used in structuring the electrodes in oxygen plasma at 35° C. (substrate temperature) 0.5 mbar pressure for 10 minutes (flow of 100sccm, power of 0.7W/cm$^2$).

Tests of diodes constructed as described above, with and without the barrier layer 4 were undertaken. In those diodes constructed without the $_2$ barrier layer 4, all cells were defunct at 50 volts. With cells constructed having a silicon oxide$_2$ barrier layer 4, two-thirds of the cells were still functional at 50 volts. Using a surface electrode 5 consisting of indium tin oxide, the inverse current at 4 volts in those diodes without a $_2$ barrier layer was $3 \times 10^{-7}$ A/cm$^2$, and was $5 \times 10^{-9}$ A/cm$^2$ in those cells having a silicon oxide $_2$ barrier layer 4.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for manufacturing a highly blocking diode structure disposed on an insulating substrate comprising in sequence the steps of:
   generating a metallic base electrode on said substrate;
   generating a layer of undoped a-Si:H on said base electrode by glow-discharge deposition;
   generating a barrier layer consisting of silicon oxide disposed on said a-Si:H layer by plasma oxidizing the exposed a-Si:H layer; and
   generating a transparent surface electrode over said barrier layer and selecting the material for said transparent surface electrode from the group consisting of conductive oxides and metal silicides.

2. A method as claimed in claim 1, wherein the step of generating a metallic base electrode is further defined by generating a metallic base electrode on a glass substrate.

3. A method as claimed in claim 1, wherein the step or generating a metallic base electrode is further defined by generating a titanium base electrode on said substrate.

4. A method as claimed in claim 3, wherein the step of generating a titanium base electrode is further defined by generating a titanium base electrode on said substrate having a thickness of about 300 nm.

5. A method as claimed in claim 1, wherein the step of generating a layer of undoped a-Si:H is further defined by generating a layer of undoped a-Si:H on said base electrode having a thickness of about 1000 nm by glow-discharge deposition.

6. A method as claimed in claim 1, wherein the step of generating a barrier layer is further defined by generating a barrier layer consisting of a layer of about 1 nm in thickness of silicon oxide disposed on said a-Si:H layer by plasma oxidizing the exposed a-Si:H layer.

7. A method as claimed in claim 1, wherein the step of generating a transparent surface electrode is further defined by generating a transparent indium tin oxide surface electrode over said barrier layer.

8. A method as claimed in claim 7, wherein the step of generating an indium tin oxide surface electrode is further defined by generating a layer of about 100 nm in thickness of indium tin oxide as a transparent surface electrode over said barrier layer.

9. A method as claimed in claim 1, wherein the step of generating a transparent surface electrode is further defined by generating transparent palladium silicide surface electrode over said barrier layer.

10. A method as claimed in claim 9, wherein the step of generating a transparent palladium silicide surface electrode is further defined by generating a layer of about 10nm in thickness of palladium silicide as a transparent surface electrode over said barrier layer.

* * * * *